United States Patent [19]

Takayama

[11] Patent Number: 5,699,063

[45] Date of Patent: Dec. 16, 1997

[54] ANALOG SIGNAL INPUT CIRCUITRY WITH AN ANALOG-TO-DIGITAL CONVERTER IN A SEMICONDUCTOR DEVICE

[75] Inventor: Shigeru Takayama, Tokyo, Japan

[73] Assignee: NEC Corporation, Tokyo, Japan

[21] Appl. No.: 638,827

[22] Filed: Apr. 29, 1996

[30] Foreign Application Priority Data

Apr. 27, 1995 [JP] Japan .................... 7-103746

[51] Int. Cl.$^6$ .................................. H03M 1/00
[52] U.S. Cl. ................... 341/118; 341/120; 327/100; 327/94
[58] Field of Search .................... 327/100, 362, 327/530, 415, 80, 77, 90, 94, 407; 341/110, 112, 118, 120

[56] References Cited

U.S. PATENT DOCUMENTS 5,331,321  7/1994  Mannonen ................. 341/110

Primary Examiner—Timothy P. Callahan
Assistant Examiner—Dinh T. Le
Attorney, Agent, or Firm—Young & Thompson

[57] ABSTRACT

The analog signal input circuit comprises an analog-to-digital circuit and a conversion error measuring circuit. The conversion error measuring circuit comprises the following elements. A first switching device is provided between an analog signal input terminal and the sample/hold circuit for disconnecting the analog-to-digital circuit from the analog signal input terminal when measuring a conversion error value. A reference voltage generation circuit is connected via a second switching device between the first switching device and the sample/hold circuit. The correction reference voltage generation circuit generates a correction reference voltage in relation to the A/D conversion reference voltage. The second switching device is operated to connect the analog-to-digital circuit to the correction reference voltage generation circuit when measuring the conversion error value. A conversion error value memory is provided for storing a conversion error value defined as a difference between the correction reference voltage and the A/D conversion reference voltage.

2 Claims, 4 Drawing Sheets

ANALOG SIGNAL INPUT CIRCUITRY WITH AN ANALOG-TO-DIGITAL CONVERTER IN A SEMICONDUCTOR DEVICE

BACKGROUND OF THE INVENTION

The present invention relates to an analog signal input circuitry with an analog-to-digital converter in a semiconductor device.

A conventional analog signal input circuit in a microcomputer 21 will be described with reference to FIG. 1. The conventional analog signal input circuit has an analog-to-digital converter for converting input analog signals into digital signals for subsequent digital signal processing by the microcomputer 21. FIG. 1 illustrates the conventional analog signal input circuit in microcomputer 21. The conventional analog signal input circuit is connected to a power voltage Vdd terminal 2, a Vref terminal 3, a Vss terminal 4 and an analog signal input terminal 5. The conventional analog signal input circuit is also connected to a data bus 20 of the microcomputer 21. The conventional analog signal input circuit comprises the following elements. An external resistor 1 having a resistance Rl is provided to connect the power Vdd terminal 2 to the Vref terminal 3. A rudder resistor 6 is provided to connect the Vref terminal 3 to the Vss terminal 4. The Vss terminal is grounded. A multiplexer 7 is connected to the rudder resistor 6. A sample/hold circuit 10 is provided to be connected to the analog signal input terminal 5. The sample/hold circuit 10 has an input side and an output side. The sample/hold circuit 10 comprises a switch 16 connecting the input and output sides and a capacitor provided between the output side and the ground. A comparator 9 has two input terminals and an output terminal. The comparator 9 is biased by a voltage Vdd. The two input terminals are connected to the multiplexer 7 and the output side of the sample/hold circuit 10 respectively. A successive comparison register 11 has an input side which is connected to the output side of the comparator 9 and an output side. A translation register 12 is provided to be connected via a data bus to the output side of the successive comparison register 11 for receiving data from the successive comparison register 11. The translation register 12 is provided to be connected to a data bus 20. A decoder 8 is provided which has an input side and an output side. The input side of the decoder 8 is connected to the output side of the successive comparison register 11 for receiving data from the successive comparison register 11. The output side of the decoder 8 is connected to the multiplexer 7 so that the multiplexer 7 receives data from the decoder 8.

A power voltage Vdd is supplied to the power voltage Vdd terminal 2, while the Vss terminal has the ground potential. As described above, the external resistor 1 is provided between the power voltage terminal Vdd 2 and the Vref terminal 3 and further the rudder resistor 6 is provided between the Vref terminal 3 and the Vss terminal having the ground potential. The power voltage Vdd is divided by the external resistor 1 and the rudder resistor 6 into the reference voltage Vref which appears on the Vref terminal 3. Assuming that the rudder resistor 6 has a resistance Ri and the external resistor 1 has a resistance Rl, the reference voltage Vref, into which the power voltage Vdd is divided with both the external resistor 1 and the rudder resistor 6, is represented by the following equation.

$$Vref=Vdd\{Ri/(Ri+Rl)\}$$

The reference voltage Vref is used as an input reference voltage, with reference to which an analog input signal is input through the analog signal input terminal 5 into the analog-to-digital converter. The sample/hold circuit 17 receives and holds the analog input signals input through the analog input terminal 5. The multiplexer 7 selects the level of voltage divided by the rudder resistor 6. The comparator 9 compares an output voltage fetched from the multiplexer 7 with an output voltage fetched from the sample/hold circuit 10 to thereby provide digital signals obtained by the analog-to-digital conversion. The successive comparison register 11 stores the results of the comparison by the comparator 9 between the output voltage fetched from the multiplexer 7 and the output voltage fetched from the sample/hold circuit 17. The decoder 8 fetches and decodes the distal signals obtained by the analog-to-digital conversion as the result of the comparison for subsequently supplying the multiplexer 7 with divisional voltage selection information in accordance with which the multiplexer 7 selects the level of voltage divided by the rudder resistor 6. The translation register 12 stores the digital signals obtained by the analog-to-digital conversion as the result of the comparison.

The digital data stored in the translation register 12 is then transmitted via the bus 20 to a central processing unit not illustrated in FIG. 1 but accommodated in the microcomputer 21 so that the central processing unit reads out the digital data fetched from the translation register 12. In this case, the analog-to-digital conversion was carried out in accordance with the successive comparison system so that the divided voltage output from the rudder resistor 6 is selected in accordance with the weight n-bit digital values. For example, Vref/2, either Vref/4 or 3Vref/4, either Vref/8, 3Vref/8, 5Vref/8, 7Vref/8, . . . $\{(2m+1)Vref/2^n\}(m=0,1,2,\ldots 2^{n-1})$ which appear on the rudder resistor 6 are selected by the multiplexer 7 in accordance with the results of the comparison stored in the successive comparison register 11 for subsequent output of the selected voltage levels from the multiplexer 7. The selected voltage level is then transmitted into the comparator 9 so that the comparator 9 executes the successive comparisons of the selected voltage levels with the voltage levels of the analog signals fetched from the sample/hold circuit 10. The results of the above successive comparisons are then transmitted into the successive comparison register 11 for storing the transmitted results of the successive comparisons in the successive comparison register 11 sequentially from a most significant bit of the successive comparison register 11. In the manner described above, the analog-to-digital conversion is carried out. Thereafter, the digital data are provided to the translation register 12 to be stored therein.

In the Japanese laid-open patent application No. 61-245065, it is disclosed that when an analog signal is input, a corrected value obtained in the input of a reference signal was previously stored, so that the corrected value can be used as an input reference voltage to conduct the analog-to-digital conversion.

The above conventional analog signal input circuitry has the following disadvantages. As described above, the input reference voltage Vref is defined by a ratio of the resistance of the external resistor 1 to that of the rudder resistor 6. In view of the actual manufacturing technique, however, it is difficult to obtain accurate predetermined resistances values of the external resistor 1 and the rudder resistor 6 without any variation. It is also hard to suppress any variation in resistances value of the external resistor 1 and the rudder resistor 6 due to a difference in temperature coefficient thereof. If the input reference voltage has any erroneous variation in voltage, then any conversion error may be generated in the convened digital value from the analog input voltage.

Even if there is no difference in resistance between the external resistor 1 and the rudder resistor 6, a voltage variation of the power voltage Vdd causes any error in performance of the analog-to-digital conversion with reference to analog input signals. It is also difficult to compensate for this error during the analog-to-digital conversion.

In order to reduce the current consumption at the input reference voltage terminal Vref 3, it was proposed to use, in place of the external resistor 1, a switching device such as MOS transistor. However, the MOS transistor has an ON-resistance which causes a voltage drop of the input reference voltage Vref. This voltage drop of the input reference voltage Vref causes any error during analog-to-digital conversion. It is difficult to compensate for this error during analog-to-digital conversion.

In this case, it is necessary to compensate for variations of circuit elements used in an amplifier for amplifying the input signal voltages. For this reason, it is necessary to store the correction value in the circuit. Although it is also necessary to measure the variation in the input reference voltage of the analog-to-digital converter circuit, it is difficult to measure the variation in the input reference voltage.

In the above circumstances, it had been required to develop a novel analog-to-digital conversion circuitry free from the above disadvantages and problems.

SUMMARY OF THE INVENTION

Accordingly, it is an object of the present invention to provide a novel analog-to-digital conversion circuitry free from the above disadvantages and problems.

It is a further object of the present invention to provide a novel analog-to-digital conversion circuitry which is capable of compensation of variations in the converted distal values.

The above and other objects, features and advantages of the present invention will be apparent from the following descriptions.

The present invention provides an analog signal input circuitry having an analog-to-digital converter circuit and a conversion error measuring circuit.

The analog signal input circuit is connected to a power voltage Vdd terminal, a Vref terminal, a Vss terminal and an analog signal input terminal. The analog signal input circuit is also connected to a data bus of the microcomputer. The analog signal input circuit comprises the following elements. An external resistor connects the power Vdd terminal to the Vref terminal. A rudder resistor connect the Vref terminal to the Vss terminal, The Vss terminal is grounded. A multiplexer is connected to the rudder resistor. A sample/hold circuit is provided to be connected to the analog signal input terminal. The sample/hold circuit has an input side and an output side. The sample/hold circuit comprises a switch connecting the input and output sides and a capacitor provided between the output side and the ground. A comparator has two input terminals and an output terminal. The comparator is biased by a voltage Vdd. The two input terminals are connected to the multiplexer and the output side of the sample/hold circuit respectively and an output terminal. A successive comparison register has an input side which is connected to the output side of the comparator and an output side. A translation register is provided to be connected via a data bus to the output side of the successive comparison register for receiving data from the successive comparison register. The translation register is provided to be connected to a data bus. A decoder is provided which has an input side and an output side. The input side of the decoder is connected to the output side of the successive comparison register for receiving data from the successive comparison register. The input side of the decoder is connected to the multiplexer so that the multiplexer receive data from the decoder.

The conversion error measuring circuit comprises the following elements. A first switching device is provided between an analog signal input terminal and the sample/hold circuit for disconnecting the analog-to-digital circuit from the analog signal input terminal in a measurement operation for measuring a conversion error value. A correction reference voltage generation circuit is connected via a second switching device between the first switching device and the sample/hold circuit. The correction reference voltage generation circuit generates a correction reference voltage in relation to the A/D conversion reference voltage. The second switching device connects the analog-to-digital circuit to the correction reference voltage generation circuit when measuring the conversion error value. A conversion error value memory is provided for storing a conversion error value defined as a difference between the correction reference voltage and the A/D conversion reference voltage.

The conversion error value is used as a base on which the correction coefficient is calculated by an arithmetic circuit included in a semiconductor device so that a correction value is obtained by the product of the calculated correction coefficient and the digital value into which the analog signal has been converted.

The above correction reference voltage generation circuit may comprise first and second resistors connected in series between a power supply line and a ground line, wherein an intermediate point between the first and second resistors is electrically connected to the second switching device. Alternatively, the above correction reference voltage generation circuit may comprise a first resistor and a Zener diode, both of which are connected in series between a power supply line and a ground line, wherein the first resistor is connected to the power supply line and the Zener diode is connected to the ground line. An intermediate point between the first resistor and the Zener diode is electrically connected to the second switching device.

BRIEF DESCRIPTIONS OF THE DRAWINGS

Preferred embodiments of the present invention will be described in detail with reference to the accompanying drawings.

EMBODIMENTS

Figure 1:
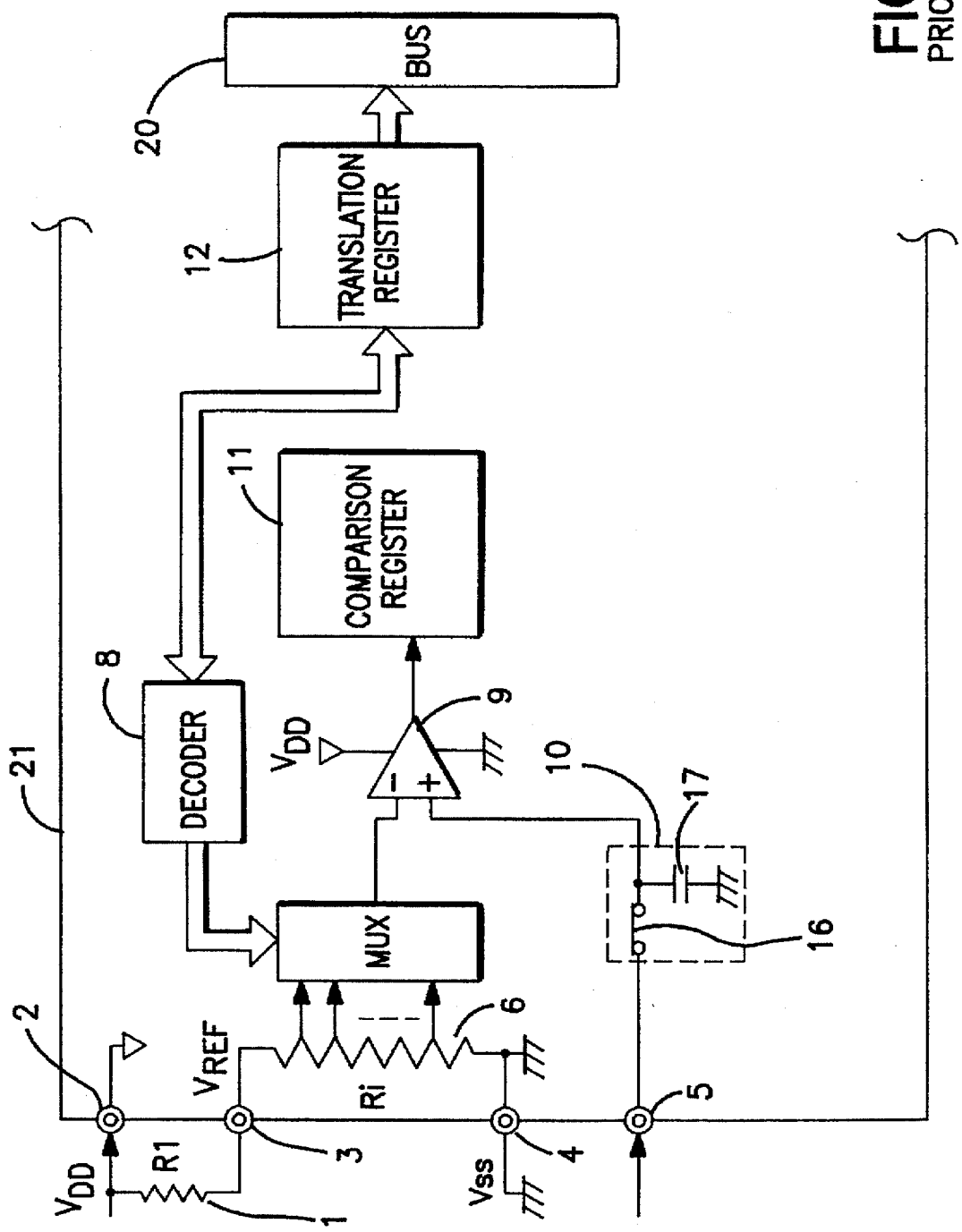
FIG. 1 is a circuit diagram illustrative of the conventional analog signal input circuit in a microcomputer.
Figure 2:
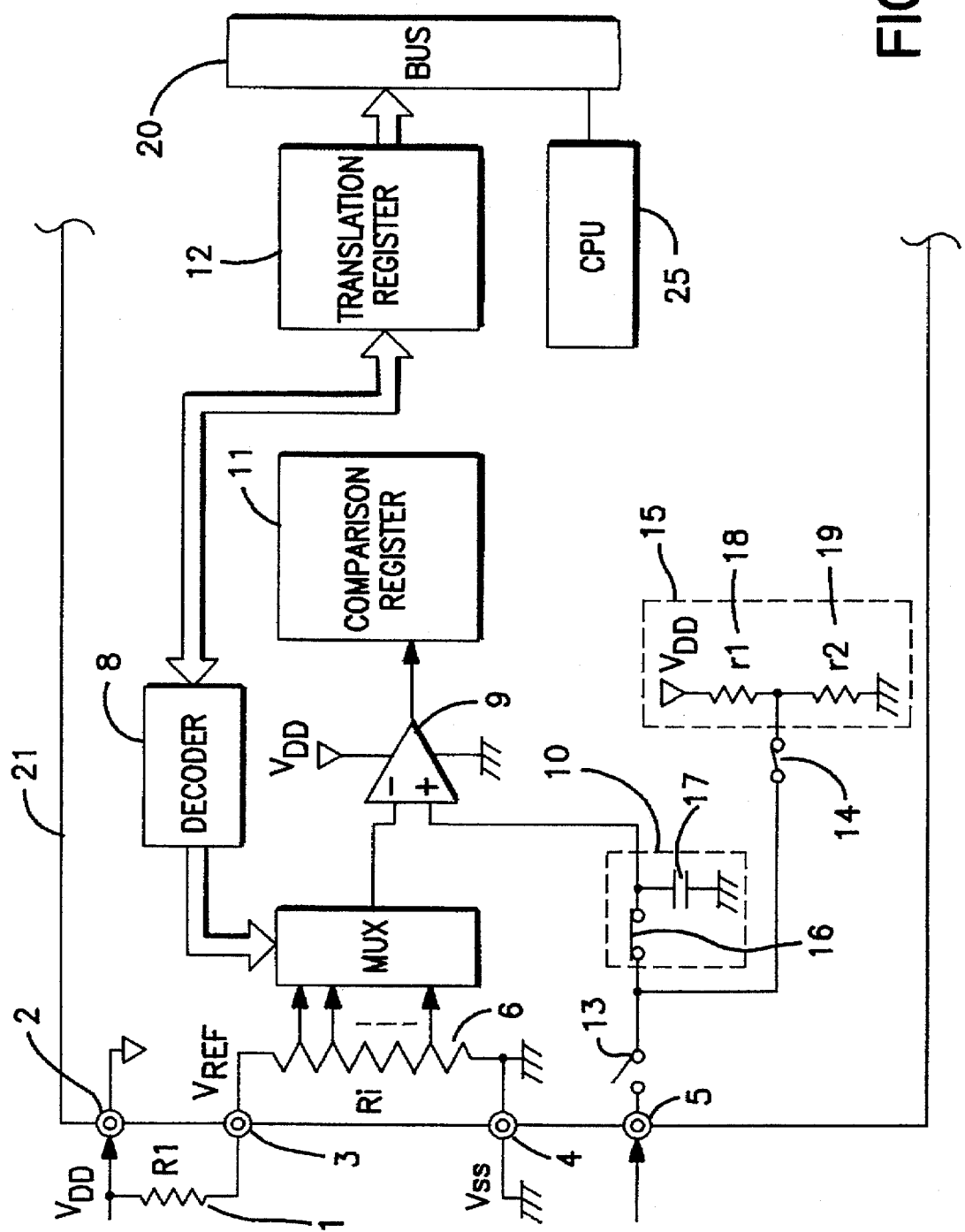
FIG. 2 is a circuit diagram illustrative of a novel analog signal input circuit in a microcomputer in a first embodiment according to the present invention.

A first embodiment according to the present invention will be described with reference to FIG. 2. The novel analog signal input circuit has an analog-to-digital converter and a conversion error measuring circuit. FIG. 2 illustrates the first embodiment, the conventional analog signal input circuit in microcomputer 21. The conventional analog signal input circuit is connected to a power voltage Vdd terminal 2, a Vref terminal 3, a Vss terminal 4 and an analog signal input terminal 5. The conventional analog signal input circuit is also connected to a data bus 20 of the microcomputer 21. The conventional analog signal input circuit comprises the following elements. An external resistor 1 having a resistance Rl is provided to connect the power Vdd terminal 2 to the Vref terminal 3. A rudder resistor 6 is provided to connect the Vref terminal 3 to the Vss terminal 4. The Vss terminal is grounded. A multiplexer 7 is connected to the rudder resistor 6. A sample/hold circuit 10 is provided to be connected to the analog signal input terminal 5. The sample/hold circuit 10 has an input side and an output side. The sample/hold circuit 10 comprises a switch 16 connecting the input and output sides and a capacitor provided between the output side and the ground. A comparator 9 has two input terminals and an output terminal. The comparator 9 is biased by a voltage Vdd. The two input terminals are connected to the multiplexer 7 and the output side of the sample/hold circuit 10 respectively. A successive comparison register 11 has an input side which is connected to the output side of the comparator 9 and an output side. A translation register 12 is provided to be connected via a data bus to the output side of the successive comparison register 11 for receiving data from the successive comparison register 11. The translation register 12 is provided to be connected to a data bus 20. A decoder 8 is provided which has an input side and an output side. The input side of the decoder 8 is connected to the output side of the successive comparison register 11 for receiving data from the successive comparison register 11. The output side of the decoder 8 is connected to the multiplexer 7 so that the multiplexer 7 receives data from the decoder 8.

The conversion error measuring circuit comprises the following elements. A first switching device 13 is provided between an analog signal input terminal 5 and the sample/hold circuit 10. The first switching device 13 is operated to disconnect the analog-to-digital circuit from the analog signal input terminal when for measuring a conversion error value. A correction reference voltage generation circuit 15 is connected via a second switching device 14 between the first switching device 13 and the sample/hold circuit 10. The correction reference voltage generation circuit 15 generates a correction reference voltage in relation to the A/D conversion reference voltage. The second switching device 14 connects the analog-to-digital circuit to the correction reference voltage generation circuit 15 when for measuring the conversion error value.

The conversion error value is used as a base on which the correction coefficient is calculated by an arithmetic circuit included in a semiconductor device so that a correction value is obtained by the product of the calculated correction coefficient and the digital value into which the analog signal has been converted.

The above correction reference voltage generation circuit 15 may comprise first and second resistors 18 and 19 connected in series between a power supply line Vdd and a ground line, wherein an intermediate point between the first and second resistors 18 and 19 is electrically connected to the second switching device 14. The first and second resistors 18 and 19 have first and second resistances values r1 and r2 respectively.

An example of the measurement of the conversion error will be described, assuming that the resistance Rl of the external resistor 1 is the same as the resistance Ri of the rudder resistor 6 and that the second resistance r2 of the second resistor 19 is three times larger than the first resistance r1 of the first resistor 18.

If the external resistor 1 and the rudder resistor 6 have no variation and Rl=Ri, then the input reference voltage Vref is Vdd/2. In this case, it is assumed that the sample/hold circuit 10 has a has a voltage of Vdd/2 and also that a digital value corresponding to a full scale value "d" is stored in the translation resistor 12 as a result of the analog-to-digital conversion. In a reference voltage signal conversion cycle 101 illustrated in FIG. 3 (i.e., switch 13 is open and switch 14 is closed), a reference voltage of Vdd/4 is input to the sample hold circuit 10 from circuit 15. Thus, a digital value d/2 is stored in the translation register 12 after the reference voltage conversion.

By contrast, if the external resistor 1 has a variation of $\Delta Rl$ and the rudder resistor 6 has a variation of $\Delta Ri$, the input reference voltage Vref at terminal 3 is generated with a variation "k".

$$Vref=Vdd \times (Ri+\Delta Ri)/(Ri+Rl+\Delta Ri+\Delta Rl)$$

$$k=Vdd\times\{((Ri+\Delta Ri)/(Ri+Rl+\Delta Ri+\Delta Rl)-\tfrac{1}{2})\}$$

When the reference voltage Vdd/4 is subjected to the analog-to-digital conversion, the variation "k" generates a conversion error "dk" represented by the following formula.

$$dk=d/2-d0=d/2-(Vdd/4)d/(Vdd/2+k)=d/2-(d/4)(Ri+Rl+\Delta Ri+\Delta Rl)/(Ri+\Delta Ri)$$

where d0 is the result of the conversion of the reference voltage Vdd/4. After the reference voltage conversion, the digital value d0 is stored in the translation resistor 12.

Figure 3:
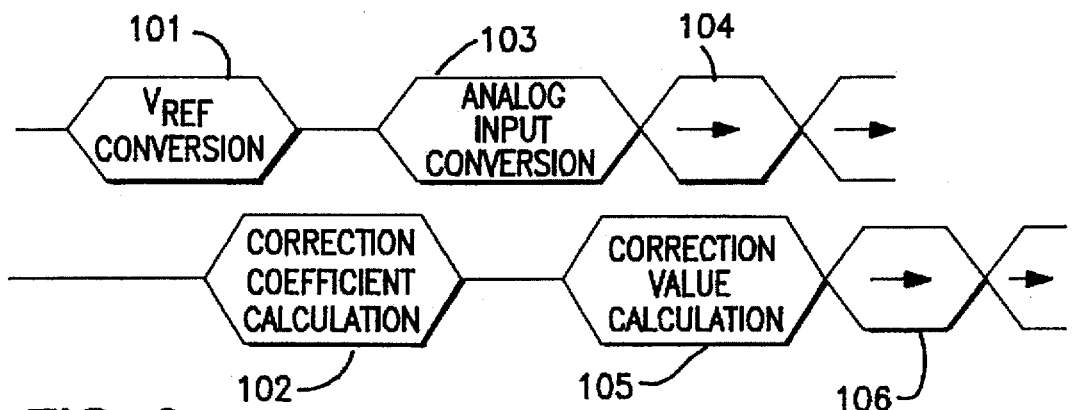
FIG. 3 is diagram illustrative of operation cycles of a novel analog signal input circuit in a microcomputer in a first embodiment according to the present invention.

As illustrated in FIG. 3: in a correction coefficient calculation cycle 102, the digital value d0 stored in the translation resistor 12 as the result of the analog-to-digital conversion is then transmitted via the data bus 20 to a central processing unit 25 of the microcomputer 21. The correction coefficient (h=d0/(d/2)) is calculated by the arithmetic circuit in the central processing unit. After the analog input conversion cycles 103 and 104 have been completed, (i.e., with switch 13 closed and switch 14 open) the operations enter into the corresponding correction value calculation cycles 105 and 106. In the correction value calculation cycles, the A/D-converted value "dn" prior to the correction is stored in the translation register 12. The A/D-convened value "dn" is transmitted via the data bus 20 to the central processing unit of the microcomputer 21 for read out operation. The arithmetic circuit in the central processing unit calculates the correction value dn' by calculating the product of dn×h. As a result, the conversion error can be corrected. In the analog input conversion cycles 103 and 104, the first switching device 13 is in the ON-state, while the second switching device 14 is in the OFF-state so that the analog signal inputted in the analog signal input terminal 5 is then transmitted to the sample/hold circuit 10.

Figure 4:
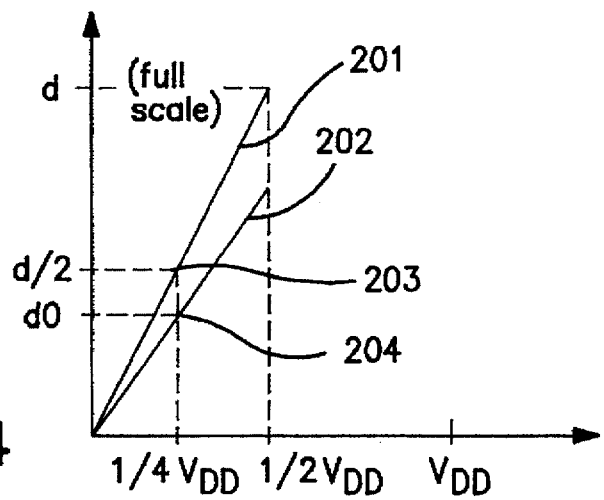
FIG. 4 is a diagram illustrative of a property in an A/D conversion of a novel analog signal input circuit in a microcomputer in a first embodiment according to the present invention.

In FIG. 4, the line 201 represents an ideal A/D conversion property, when Rl=Ri. The line 202 represents an actual A/D conversion property when Rl Ri have variations. The point 203 represents an ideal A/D conversion property when the reference voltage is Vdd4. The point 204 represents an actual A/D conversion property when the reference voltage is Vdd/4.

Figure 5:
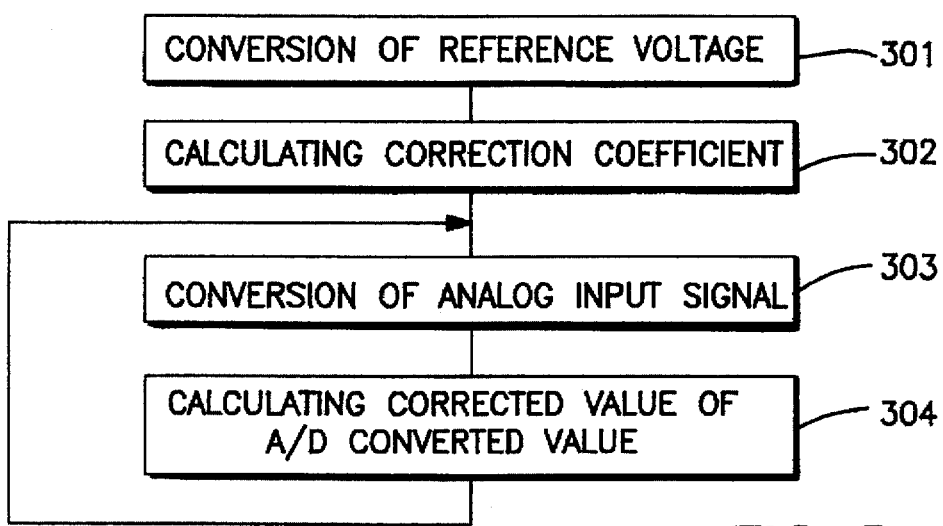
FIG. 5 is a flow chart illustrative of processes for correction of a conversion error by novel analog signal input circuit in a microcomputer in a first embodiment according to the present invention.

In FIG. 5, the correction procedures are illustrated. In a step 301, the reference voltage is converted into the value d0. In a step 302, the correction coefficient h is calculated. In a step 303, the input analog signal is converted into the value dn. In a step 304, the correction value of the value dn is calculated. The steps 303 and 304 are repeated.

The correction reference voltage generation circuit 15 generates the correction reference voltage which is defined by the ratio of resistances of the first resistor 18 and the second resistor 19. If the correction reference voltage generation circuit 15 having the first and second resistors 18 and 19 is formed on a common semiconductor substrate with the analog-to-digital circuit, then the ratio of resistance of the first resistor 18 and the second register 19 remains unchanged even when there are variations in resistances of the first and second resistors 18 and 19, for example, due to variation in temperature. The correction reference voltage generation circuit 15 remains available in a wide temperature range. It is possible to correct the A/D conversion error generated due to variation in voltage of the power supply or a drop of the input reference voltage.

In accordance with the present invention, as described above, the correction reference voltage generation circuit is provided to correct the A/D conversion error.

Figure 6:
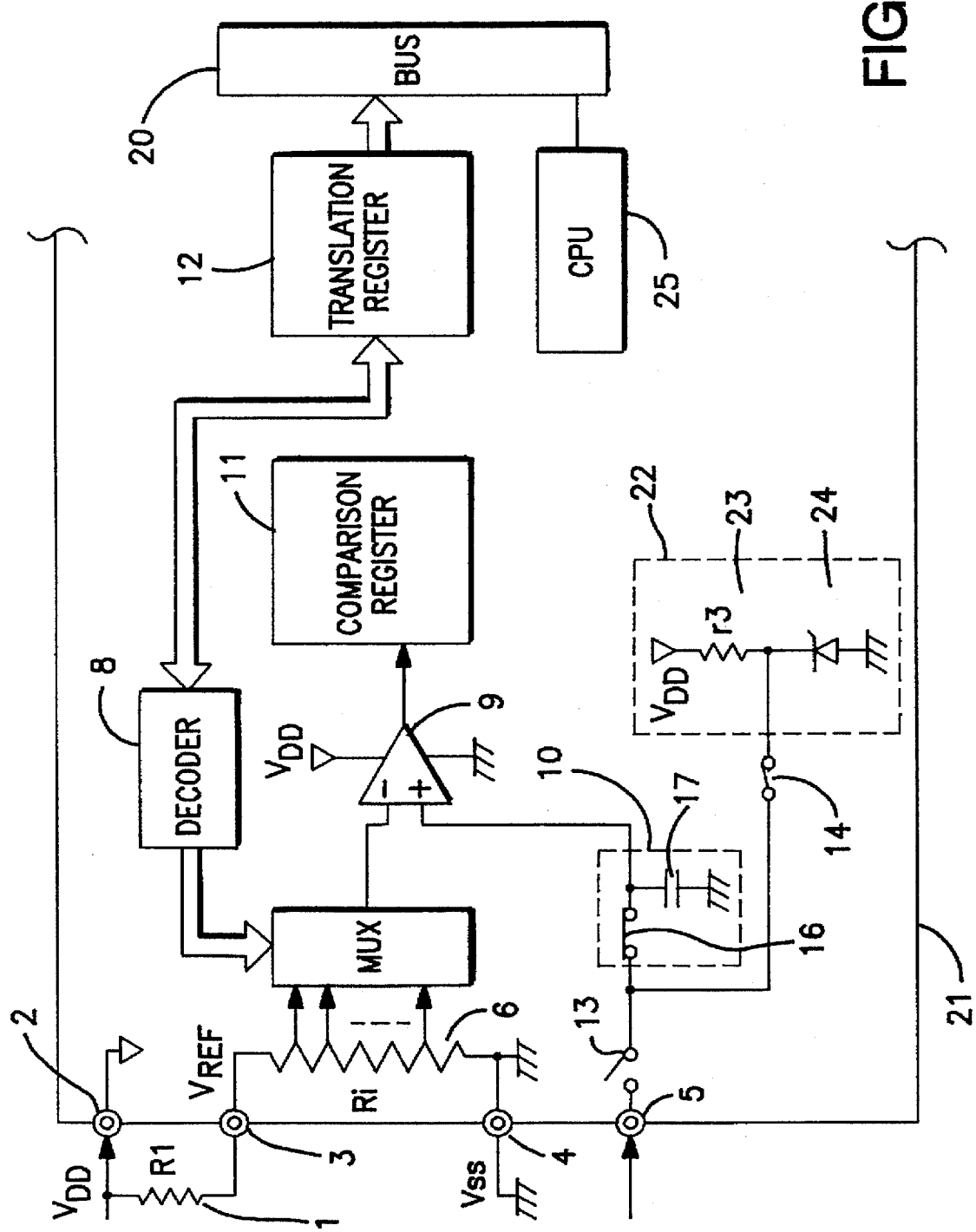
FIG. 6 is a circuit diagram illustrative of a novel analog signal input circuit in a microcomputer in a second embodiment according to the present invention.

A second embodiment according to the present invention will be described with reference to FIG. 6. The novel analog signal input circuit has an analog-to-digital converter and a conversion error measuring circuit. FIG. 6 illustrates the second embodiment in the conventional analog signal input circuit. The conventional analog signal input circuit is connected to a prover voltage Vdd terminal 2, a Vref terminal 3, a Vss terminal 4 and an analog signal input terminal 5. The conventional analog signal input circuit is also connected to a data bus 20 of the microcomputer 21. The conventional analog signal input circuit comprises the following elements. An external resistor 1 having a resistance R1 is provided to connect the power Vdd terminal 2 to the Vref terminal 3. A rudder resistor 6 is provided to connect the Vref terminal 3 to the Vss terminal 4. The Vss terminal is grounded. A multiplexer 7 is connected to the rudder resistor 6. A sample/hold circuit 10 is provided to be connected to the analog signal input terminal 5. The sample/hold circuit 10 has an input side and an output side. The sample/hold circuit 10 comprises a switch 16 connecting the input and output sides and a capacitor provided between the output side and the ground. A comparator 9 has two input terminals and an output terminal. The comparator 9 is biased by a voltage Vdd. The two input terminals are connected to the multiplexer 7 and the output side of the sample/hold circuit 10 respectively. A successive comparison register 11 has an input side which is connected to the output side of the comparator 9 and an output side. A translation register 12 is provided to be connected via a data bus to the output side of the successive comparison register 11 for receiving data from the successive comparison register 11. The translation register 12 is provided to be connected to a data bus 20. A decoder 8 is provided which has an input side and an output side. The input side of the decoder 8 is connected to the output side of the successive comparison register 11 for receiving data from the successive comparison register 11. The output side of the decoder 8 is connected to the multiplexer 7 so that the multiplexer 7 receives data from the decoder 8.

The conversion error measuring circuit comprises the following elements. A first switching device 13 is provided between an analog signal input terminal 5 and the sample/hold circuit 10. The first switching device 13 is operated to disconnect the analog-to-digital circuit from the analog signal input terminal when measuring a conversion error value. A correction reference voltage generation circuit 22 is connected via a second switching device 14 between the first switching device 13 and the sample/hold circuit 10. The correction reference voltage generation circuit 22 generates a correction reference voltage in relation to the A/D conversion reference voltage. The second switching device 14 connects the analog-to-digital circuit to the correction reference voltage generation circuit 22 when measuring the conversion error value.

The conversion error value is used as a base on which the correction coefficient is calculated by an arithmetic circuit included in a semiconductor device so that a correction value is obtained by the product of the calculated correction coefficient and the digital value into which the analog signal has been converted.

The above correction reference voltage generation circuit 22 comprises a first resistor 23 having a resistance $r^3$ and a Zener diode 24, both of which are connected in series between a power supply line Vdd and a ground line, wherein the first resistor 23 is connected to the power supply line and the Zener diode 24 is connected to the ground line. An intermediate point between the first resistor 23 and the Zener diode 24 is electrically connected to the second switching device 14.

In the correction reference voltage generation circuit 22, a constant reference voltage Vzd is applied over the Zener diode 24. If the input reference voltage (Vref=Vdd/2) has a variation "k", the A/D converted value dk into which the reference voltage Vzd is A/D-converted is given as follows.

$$dk = \{Vzd/(Vdd/2)\}d - \{Vzd/(Vdd/2+k)\}d$$

where the second term represents the actual A/D converted value of the reference voltage Vzd. The correction coefficient h is calculated from the following formula.

$$h = \{Vzd/(Vdd/2+k)\}/\{Vzd/(Vdd/2)\}$$

In the same manner as in the first embodiment, the A/D conversion error can be corrected.

As a modification, the present invention is applicable when the Vref terminal 3 is directly connected to the Vdd terminal without the external resistor 1 or when a MOS transistor is provided between the Vdd terminal and the Vref terminal in place of the external resistor 1. In those cases, even if a voltage drop is generated by the variation of the power voltage or the resistance of the MOS transistor, the reference voltage Vzd of the Zener diode 24 remains unchanged. Assuming that the variation of the power voltage Vdd or the difference of the reference voltage Vref from the power voltage Vdd is Δ Vdd, the A/D conversion error dn and the correction coefficient h represent as follows.

$$dk = (Vzd/Vdd)d - \{Vzd/(Vdd+\Delta Vdd)\}d$$

$$h = \{Vzd/(Vdd+\Delta Vdd)\}/(Vzd/Vdd)$$

In the same manner as in the first embodiment, the A/D conversion error can be corrected.

What is claimed is:

1. An analog-to-digital converter comprising:
 a reference voltage terminal for providing a reference voltage for the analog-to-digital converter and which is connected between (a) an external resistor which is connected to a power supply and (b) a rudder resistor connected to ground;
 an analog signal input terminal for receiving an analog input signal and for applying the analog input signal to a sample and hold circuit;

a comparator for comparing an output of said sample and hold circuit to a voltage selectively provided by a multiplexer which selectively divides a voltage from said rudder resistor, to thereby convert the analog input signal to a digital output signal, the digital output signal being provided from said comparator to a conversion register;

a decoder for providing the digital output signal from said conversion register to said multiplexer and to a translation register which provides the digital output signal to a processing unit;

wherein variations in the resistances of said external resistor and said rudder resistor cause a conversion error in the conversion of the analog input signal to the digital output signal;

a first switch for disconnecting said analog input terminal from said sample and hold circuit when the conversion error is to be evaluated;

a conversion reference voltage generating circuit for providing a conversion error reference voltage when the conversion error is to be evaluated, said conversion reference voltage generating circuit comprising a first resistor and a second resistor connected between the power supply and ground and having a node between said first and second resistors for providing the conversion error reference voltage; and a second switch for connecting said conversion reference voltage generating circuit to said sample and hold circuit when the conversion error is to be evaluated, wherein a conversion digital output signal corresponding to the conversion error reference voltage is provided as an output from said translation register when the conversion error is to be evaluated;

said processing unit for determining a conversion error correction coefficient from a comparison of the conversion digital output signal from said translation register to a digital value corresponding to the conversion error reference voltage stored in said processing unit when the conversion error is to be evaluated, said processing unit further for applying the conversion error correction coefficient to the digital output signal from said translation register when the analog input signal is applied to said sample and hold circuit, whereby the conversion error caused by said external and rudder resistors is corrected.

2. An analog-to-digital converter comprising:

a reference voltage terminal for providing a reference voltage for the analog-to-digital converter and which is connected between (a) an external resistor which is connected to a power supply and (b) a rudder resistor connected to ground;

an analog signal input terminal for receiving an analog input signal and for applying the analog input signal to a sample and hold circuit;

a comparator for comparing an output of said sample and hold circuit to a voltage selectively provided by a multiplexer which selectively divides a voltage from said rudder resistor, to thereby convert the analog input signal to a digital output signal, the digital output signal being provided from said comparator to a conversion register;

a decoder for providing the digital output signal from said conversion register to said multiplexer and to a translation register which provides the digital output signal to a processing unit;

wherein variations in the resistances of said external resistor and said rudder resistor cause a conversion error in the conversion of the analog input signal to the digital output signal;

a first switch for disconnecting said analog input terminal from said sample and hold circuit when the conversion error is to be evaluated;

a conversion reference voltage generating circuit for providing a conversion error reference voltage when the conversion error is to be evaluated, said conversion reference voltage generating circuit comprising a first resistor and a Zener diode connected between the power supply and ground and having a node between said first resistor and said Zener diode for providing the conversion error reference voltage;

a second switch for connecting said conversion reference voltage generating circuit to said sample and hold circuit when the conversion error is to be evaluated, wherein a conversion digital output signal corresponding to the conversion error reference voltage is provided as an output from said translation register when the conversion error is to be evaluated;

said processing unit for determining a conversion error correction coefficient from a comparison of the conversion digital output signal from said translation register to a digital value corresponding to the conversion error reference voltage stored in said processing unit when the conversion error is to be evaluated, said processing unit further for applying the conversion error correction coefficient to the digital output signal from said translation register when the analog input signal is applied to said sample and hold circuit, whereby the conversion error caused by said external and rudder resistors is corrected.

\* \* \* \* \*